US008115235B2

(12) United States Patent
Pillarisetty et al.

(10) Patent No.: US 8,115,235 B2
(45) Date of Patent: Feb. 14, 2012

(54) MODULATION-DOPED HALO IN QUANTUM WELL FIELD-EFFECT TRANSISTORS, APPARATUS MADE THEREWITH, AND METHODS OF USING SAME

(75) Inventors: Ravi Pillarisetty, Portland, OR (US); Titash Rakshit, Hillsboro, OR (US); Mantu Hudait, Portland, OR (US); Marko Radosavljevic, Beaverton, OR (US); Gilbert Dewey, Hillsboro, OR (US); Benjamin Chu-Kung, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 375 days.

(21) Appl. No.: 12/378,828

(22) Filed: Feb. 20, 2009

(65) Prior Publication Data

US 2010/0213441 A1    Aug. 26, 2010

(51) Int. Cl.
*H01L 31/06* (2006.01)
(52) U.S. Cl. ............ 257/201; 257/20; 257/22; 257/194; 257/200; 257/288; 257/E29.246; 257/E29.248; 257/E29.252
(58) Field of Classification Search .................. 257/20, 257/22, 24, 191, 192, 194, 200, 201, 288, 257/E29.246, E29.248, E29.252, E21.403, 257/E21.407
See application file for complete search history.

(56) References Cited

U.S. PATENT DOCUMENTS

| 7,947,971 | B2 * | 5/2011 | Majhi et al. ................. 257/12 |
| 2002/0175346 | A1 | 11/2002 | Brar |
| 2007/0138565 | A1 | 6/2007 | Datta et al. |
| 2008/0116485 | A1 | 5/2008 | Hudait et al. |
| 2008/0203381 | A1 * | 8/2008 | Hudait et al. ................. 257/14 |
| 2010/0148153 | A1 * | 6/2010 | Hudait et al. ................. 257/24 |

FOREIGN PATENT DOCUMENTS

| WO | 2010/096241 A2 | 8/2010 |
| WO | 2010/096241 A3 | 11/2010 |

OTHER PUBLICATIONS

International Search Report and Written Opinion received for PCT Patent Application No. PCT/US2010/022047, mailed on Aug. 31, 2010, 9 pages.

* cited by examiner

*Primary Examiner* — Evan Pert
*Assistant Examiner* — Eddie A Rodela
(74) *Attorney, Agent, or Firm* — John N. Greaves

(57) ABSTRACT

A quantum well (QW) layer is provided in a semiconductive device. The QW layer is provided with a beryllium-doped halo layer in a barrier structure below the QW layer. The semiconductive device includes InGaAs bottom and top barrier layers respectively below and above the QW layer. The semiconductive device also includes a high-k gate dielectric layer that sits on the InP spacer first layer in a gate recess. A process of forming the QW layer includes using an off-cut semiconductive substrate.

12 Claims, 4 Drawing Sheets

MODULATION-DOPED HALO IN QUANTUM WELL FIELD-EFFECT TRANSISTORS, APPARATUS MADE THEREWITH, AND METHODS OF USING SAME

TECHNICAL FIELD

A variety of electronic and optoelectronic devices use thin film relaxed lattice constant III-V semiconductors on semiconductive substrates such as elemental silicon (Si) substrates. Surface layers capable of using the properties of III-V materials may host a variety of high performance electronic devices such as complementary metal oxide semiconductor (CMOS) and quantum well (QW) transistors. The growth of III-V materials upon silicon substrates, however, presents many challenges. Challenges involved with such devices include adequate short-channel effect (SCE) and Lg scalability.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. Although a processor chip and a memory chip may be mentioned in the same sentence, it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" may be understood by reference to the illustrated X-Z coordinates, and terms such as "adjacent" may be understood by reference to X-Y coordinates or to non-Z coordinates.

In various embodiments, indium gallium arsenide (InGaAs)-based semiconductor devices are formed on a semiconductive substrate such as silicon. By use of such an InGaAs-based structure, high speed and low power performance can be realized. Such structures include a modulation-doped halo layer that allows for a high dielectric constant (high k) gate dielectric for use with a metal gate.

Figure 1:
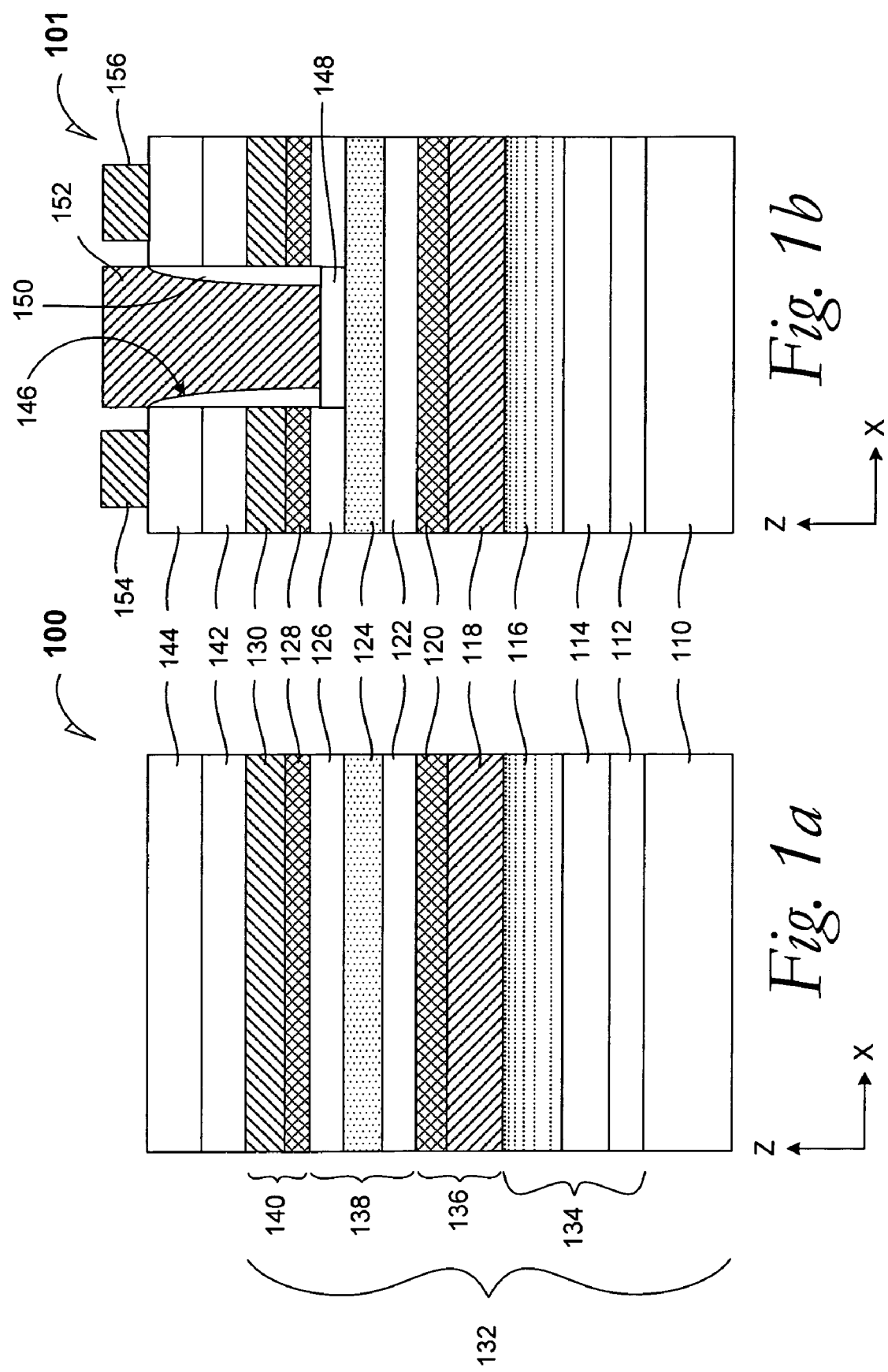
FIG. 1a is a cross-section elevation of an integrated circuit device according to an example embodiment.
FIG. 1b is a cross-section elevation of the integrated circuit device depicted in FIG. 1a after further processing according to an embodiment.

FIG. 1a is a cross-section elevation of an integrated circuit device 100 according to an example embodiment. The integrated circuit device 100 may be used to form an NMOS or PMOS device on a semiconductive substrate 110. In an embodiment, the semiconductive substrate 110 is a high resistivity n or p-type (100) off-oriented Si substrate. In an embodiment, the semiconductive substrate 110 has a vicinal surface that is prepared by off-cutting the semiconductive substrate 110 from an ingot. The (100) semiconductive substrate 110 is off cut at an angle between 2 and 8 degrees towards the [110] direction to produce a surface that may have terraces according to an embodiment. In an embodiment different off-cut orientations are used. In an embodiment, the semiconductive substrate 110 is 4° off-cut silicon.

In an embodiment, the semiconductive substrate 110 is provided without an off-cut orientation. In any event, an off-cut semiconductive substrate 110 or other substrate preparation may provide for device isolation and may also reduce anti-phase domains in anti-phase boundaries. The semiconductive substrate 110 may have a resistivity in a range from 1 ohm ($\Omega$) to 50 k$\Omega$.

A nucleation layer 112 and bottom buffer layer 114 are formed on the semiconductive substrate 110. In an embodiment, the nucleation layer 112 is made of gallium arsenide (GaAs). In an embodiment, the nucleation layer 112 is formed by a metal organic chemical vapor deposition (MOCVD) process. In an embodiment, the nucleation layer 112 is formed by a molecular beam epitaxy (MBE) process. Other processes many be used to form the nucleation layer 112. In an embodiment, the nucleation layer is a 30 nanometer (nm) thick layer of GaAs, followed by the bottom buffer layer 114 that can be formed with a thickness from 0.3 micrometer ($\mu$m) to 1 $\mu$m. The nucleation- and buffer layers 112 and 114, respectively are used to fill the lowest semiconductive substrate terraces with atomic bi-layers of III-V materials such as GaAs material. The nucleation layer 112 portion of nucleation- and bottom buffer layers 112 and 114 may create an anti-phase domain-free "virtual polar" substrate. In an embodiment, MBE is carried out at temperatures between 400° C. and 500° C. The bottom buffer layer 114 of the nucleation- and bottom buffer layer 112 and 114, respectively may provide for gliding dislocation and control of the lattice mismatch of between 4% to 8% between the semiconductive substrate 110 and a barrier layer to be formed over the nucleation- and bottom buffer layers 112 and 114. In an embodiment, the bottom buffer layer 114 is formed at a higher temperature than the nucleation layer 112. Further in an embodiment, the bottom buffer layer 114 is relatively thicker.

The nucleation layer 112 and the bottom buffer layer 114 are configured to form a dislocation filtering buffer that can provide compressive strain for an InGaAs quantum well (QW) structure as set forth below. The nucleation layer 112 and the bottom buffer layer 114 may be configured to control lattice mismatch of about 4% to minimize threading dislocations.

Further processing is depicted in FIG. 1a where a graded buffer layer 116 is formed over the bottom buffer layer 114. In an embodiment, the graded buffer layer 116 is indium aluminum arsenide ($In_xAl_{1-x}As$). Grading proceeds from x equals zero to x equals 0.52. Grading is shown with an increasingly dense composition illustration to represent the increasing presence of indium in an example embodiment. Consequently, the composition at the interface between the bottom buffer layer 114 and the graded buffer layer 116, begins as aluminum arsenide (AlAs) and finishes at the other boundary thereof as $In_{0.52}Al_{0.48}As$. In an embodiment, grading is done linearly by perturbing an indium supply in a linearly increasing manner until reaching the composition of $In_{0.52}Al_{0.48}As$. In an embodiment, the indium supply is provided in a non-linearly increasing manner such that the graded buffer layer 116 may have one of a greater- or a lesser-than-half concentration of indium at the physical midpoint of this graded buffer layer. By forming the graded buffer layer 116, dislocations may glide along relatively diagonal planes therewithin. In an embodiment, the graded buffer layer 116 has a thickness between 0.7 and 1.1 μm. In an embodiment, the graded buffer layer 116 has a thickness of 0.9 μm.

In an embodiment, the graded buffer layer 116 is inverse step graded InAlAs in order to have a larger bandgap for device isolation. In an embodiment, the graded buffer layer 116 is inverse step graded indium gallium aluminum arsenide (InGaAlAs) in order to have a larger bandgap for device isolation. The composition may begin with indium present and be at a lower concentration or even completely absent at the top surface. The presence of aluminum may modulate strain on a quantum well layer depending upon the amount of aluminum in the composition of the graded buffer layer 116. The graded buffer layer 116 may also act as a dislocation filtering buffer.

After formation of the graded buffer layer 116, a bottom barrier layer 118 is formed. In an embodiment, the bottom barrier layer 118 is formed of a larger bandgap material than what will be a quantum well layer to be formed above and on the bottom barrier layer 118. In an embodiment, the bottom barrier layer 118 is of sufficient thickness to provide a potential barrier to charge carriers in structures that are forming a transistor stack 130 that will become part of a transistor apparatus as further disclosed. In an embodiment, the bottom barrier layer 118 has a thickness between 4 nm and 120 nm. In an embodiment, the bottom barrier layer 118 has a thickness of 100 nm.

After formation of the bottom barrier layer 118, a modulation-doped halo layer layer 120 is formed above and on the bottom barrier layer 118. In an embodiment, the modulation-doped halo layer 120 is composed of beryllium (Be). In an embodiment, modulation doping of beryllium in the modulation-doped halo layer 120 is in a concentration in a range from $1 \times 10^{10}$ $cm^{-2}$ to $5 \times 10^{14}$ $cm^{-2}$.

In an embodiment, modulation doping is carried out by using a molecular beam epitaxy (MBE) growth technique. In an embodiment, modulation doping is carried out by using metal-organic chemical vapor deposition epitaxy (MOCVD epi) growth technique. In an embodiment, modulation doping is carried out by using metal-organic chemical vapor deposition epitaxy (MOCVD epi) growth technique. In an embodiment, modulation doping is carried out by using ultra-high vacuum CVD epitaxy (UHCVD epi) growth technique. In an embodiment, modulation doping is carried out by using reduced-temperature CVD epitaxy (RTCVD epi) growth technique.

In an embodiment, dopant variations for a III-V NMOS structure includes beryllium (Be) and carbon (C). In an embodiment, dopant variations for a III-V PMOS structure includes silicon (Si) and tellurium (Te). In an embodiment, dopant variations for a PMOS germanium quantum well structure may include arsenic (As), antimony (Sb), and phosphorus (P). In an embodiment, dopant amounts range from $10^{10}$ $cm^{-2}$ to $10^{14}$ $cm^{-2}$.

Because the modulation-doped halo layer 120 is separated from the quantum well layer (see 124, below), this halo embodiment will not degrade carrier mobility.

After formation of the modulation-doped halo layer layer 120, a bottom spacer layer 122 is formed thereon. In an embodiment, the bottom spacer layer 122 is an indium aluminum arsenide material. In an embodiment, the bottom spacer layer 122 is $In_{0.52}Al_{0.48}As$ and has a thickness in a range from 4 nm to 12 nm. In an embodiment, the bottom spacer layer 122 is $In_{0.52}Al_{0.48}As$ and has a thickness of 8 nm.

After formation of the bottom spacer layer 122, a quantum well (QW) layer 124 is formed. In an embodiment, the QW layer 124 is formed of a material that has a smaller bandgap than that of the bottom barrier layer 118. In an embodiment, the QW layer 124 is formed of $In_xGa_{1-x}As$, where x equals between 0.53 and 0.8. The QW layer 124 may be of sufficient thickness to provide adequate channel conductance for a given application such as a transistor for a memory cell. The QW layer 124 may be of sufficient thickness to provide adequate channel conductance for a given application such as a transistor for a logic circuit. In an embodiment, the QW layer 124 is between 10 nm and 16 nm. In an embodiment, the QW layer 124 has a thickness of 13 nm. The QW layer 124 may provide high electron mobility and velocity for NMOS devices, and also may provide high hole mobility and velocity for PMOS devices, both compared to a silicon-based device.

In an embodiment, a top spacer layer 126 is formed over the QW layer 124. The top spacer layer 126 includes an $In_{0.52}Al_{0.48}As$ material according to an embodiment. As further shown in FIG. 1a, the top spacer layer 126 is formed over the QW layer 124. The top spacer layer 126 may provide compressive strain to the QW layer 124 as it acts as a semi-conductive channel. In an embodiment, the $In_{0.52}Al_{0.48}As$ top spacer layer 126 has a thickness in a range from 0.2 nm to 8 nm. In an embodiment, the $In_{0.52}Al_{0.48}As$ spacer layer 124 has a thickness of 5 nm.

After forming the top spacer layer 126, a doping layer 128 is formed. In an embodiment, doping is selected based upon the sheet carrier concentration that is useful in the channel of the quantum well layer 124. An example concentration is $6 \times 10^{12}$ $cm^{-2}$ for a silicon doping layer 128, when doping inside the channel of the quantum well 120 is $3.5 \times 10^{12}$ $cm^{-2}$. In an embodiment, the doping layer 128 is delta-doped silicon according to known technique. In an embodiment, the doping layer 128 is modulation-doped silicon. In an embodiment, the doping layer 128 is combined delta-doped and modulation-doped. In an embodiment, the doping layer 128 is a silicon-modulation delta-doped layer having a thickness of 3 Å to 15 Å. In an NMOS device embodiment, doping of the doping layer 128 is implemented using silicon and tellurium (Te) impurities. In a PMOS device embodiment, doping of the doping layer 128 is with beryllium (Be). In a PMOS device embodiment, doping of the doping layer 128 is with carbon (C). In a PMOS device embodiment, doping of the doping layer 128 is with beryllium and carbon.

In an embodiment, doping in the modulation-doped halo layer 120 is the same as doping in the doping layer 128. In an embodiment, the same doping means the same doping element such as beryllium. In an embodiment, the same doping means doping with elements to achieve equivalent semiconductive properties in the two layers.

After formation of the doping layer 128, a top barrier layer 130 is formed to complete the device stack. In an embodiment, the top barrier layer 130 is an $In_xAl_{1-x}As$ barrier layer 130. According to an embodiment, the top barrier layer 130 has a thickness of between 4 nm and 12 nm. In an embodiment, the top barrier layer 130 has a thickness of 8 nm. The top barrier layer 130 may be a Schottky barrier layer for gate control.

A device stack embodiment may be referred to the device stack 132, which includes a buffer bottom structure 134 that includes the nucleation layer 112 on the semiconductive substrate 110, the bottom buffer layer 114, and the graded buffer layer 116. The device stack 132 also includes a bottom barrier structure 136 and a top barrier structure 140. The bottom barrier structure 136 includes the bottom barrier layer 118 and the modulation-doped halo layer 120. The top barrier structure 140 includes the doping layer 128 and the top barrier layer 130. The device stack 132 also includes a quantum well structure 138 including the bottom spacer layer 122, the QW layer 124, and the top spacer layer 126.

After formation of the device stack 132, an etch stop layer 142 is formed over the top barrier structure 140. In an embodiment, the etch stop layer 142 is indium phosphide (InP). Other etch-stop structure materials may be used that may integrate with a given specific application rule. The etch stop layer 142 may have a thickness from 2 to 10 nm. In an embodiment, the etch stop layer 142 has a thickness of 6 nm.

The device stack 132 is further processed by forming a contact layer 144 above the etch stop layer 142. The contact layer 144 provides source- and drain contact structures with low contact resistance. In an embodiment, the contact layer 144 is formed of $In_xGa_{1-x}As$. For an NMOS device stack 132 the contact layer 144 is n+ doped. The contact layer 144 may also be n++ doped. In an embodiment, the contact layer 144 is doped by grading, starting with silicon doped with $In_{0.53}Ga_{0.47}As$, and proceeding from $In_xGa_{1-x}As$ from x=0.53 to 1.0 such that grading terminates with InAs. For a PMOS device stack 132, the contact layer 144 is p+ doped. In an embodiment, graded doping is done with a p+ doping gradient. The contact layer 144 has a thickness between 10 nm and 30 nm according to an embodiment. The contact layer 144 has a thickness of 20 nm according to an embodiment.

FIG. 1b is a cross-section elevation of the integrated circuit device depicted in FIG. 1a after further processing according to an embodiment. The integrated circuit device 101 has been processed by forming a gate recess 146 that has penetrated the contact layer 144, the etch stop layer 142, the top barrier layer 130, and the silicon doping layer 128. In an embodiment, the gate recess 146 penetrates but does not breach the spacer layer 126. Processing includes forming a high-k dielectric film 148 in the gate recess 146, as well as a spacer 150 in the gate recess 146 for electrical insulation of the gate.

In an embodiment, the high-k gate dielectric film 148 has a thickness from 20 Å to 60 Å. The high-k gate dielectric film 148 is seated in a portion of the top spacer layer 126. In an embodiment, the high-k dielectric film 148 is hafnium oxide ($HfO_2$). In an embodiment, the high-k dielectric film 148 is alumina ($Al_2O_3$). In an embodiment, the high-k dielectric film 148 is tantalum pentaoxide ($Ta_2O_5$). In an embodiment, the high-k dielectric film 148 is zirconium oxide ($ZrO_2$). In an embodiment, the high-k dielectric film 148 is lanthanum aluminate ($LaAlO_3$). In an embodiment, the high-k dielectric film 148 is gadolinium scandate ($GdScO_3$). As used herein, the phrase "high-k" refers to materials having a dielectric constant, k, greater than that of silicon dioxide, that is, greater than about 4.

A gate contact 152 is formed above and on the high-k gate dielectric film 148. In an embodiment, the gate contact 152 is a titanium (Ti) material. In an embodiment, the gate contact 152 is a platinum (Pt) material. In an embodiment, the gate contact 152 is a gold (Au) material. In an embodiment, the gate contact 152 is a combination of at least two of titanium, platinum, and gold. In and embodiment, the gate contact 152 has a thickness from 60 Å to 140 Å. In and embodiment, the gate contact 152 has a thickness of 100 Å. In and embodiment, the high-k gate dielectric film 152 has a thickness of 100 Å and the gate contact 152 has a thickness of 100 Å.

A source contact 154 and a drain contact 156 are disposed above the contact layer 142. In an embodiment, the source contact 154 and drain contact 156 are the same material as the gate contact 150. In an embodiment, the source- and drain contact materials are non-alloyed layers. In an embodiment, the source- and drain contact materials are non-alloyed layers of gold (Au) deposited on germanium (Ge), which in turn is deposited on nickel (Ni) at the bottom. In an embodiment, the source- and drain contact materials are non-alloyed layers of gold (Au) deposited on platinum (Pt), which in turn is deposited on nickel (Ni) at the bottom. The integrated circuit device 101 as illustrated is a transistor apparatus that may be installed in any of several microelectronic devices.

Figure 2:
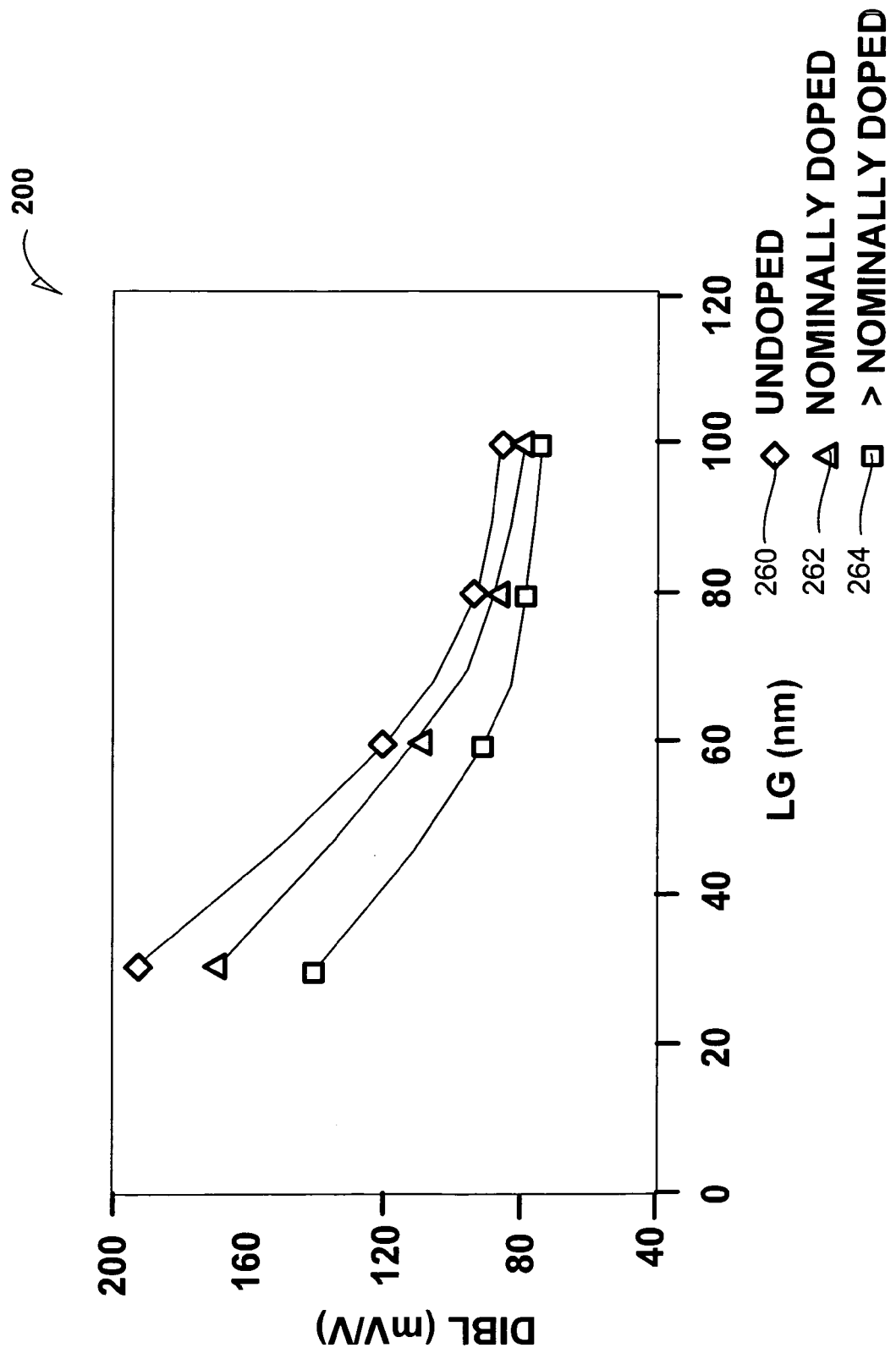
FIG. 2 is a graph to illustrate improved short-channel effects as a function of dopant concentration in the modulation doped halo layer according to embodiments

FIG. 2 is a graph 200 to illustrate improved short-channel effects as a function of dopant concentration in the modulation doped halo according to embodiments. An undoped bottom barrier 260, as well as a nominally doped bottom barrier 262, and a greater than nominally doped bottom barrier 264 are depicted in FIG. 2. In an embodiment, the nominally doped bottom barrier 262 is the modulation-doped halo layer layer 120 depicted in FIG. 1a and is composed of beryllium Be that has been implanted into the halo layer 120 to a concentration range from $1 \times 10^{10}$ cm$^{-2}$ to $1 \times 10^{14}$ cm$^{-2}$ Be in silicon. In an embodiment, the greater than nominally doped bottom barrier 264 is the modulation-doped halo layer layer 120 depicted in FIG. 1a and is composed of beryllium Be that has been implanted into the halo layer 120 to a concentration range from $1 \times 10^{10}$ cm$^{-2}$ to $1 \times 10^{14}$ cm$^{-2}$ Be in silicon.

Figure 3:
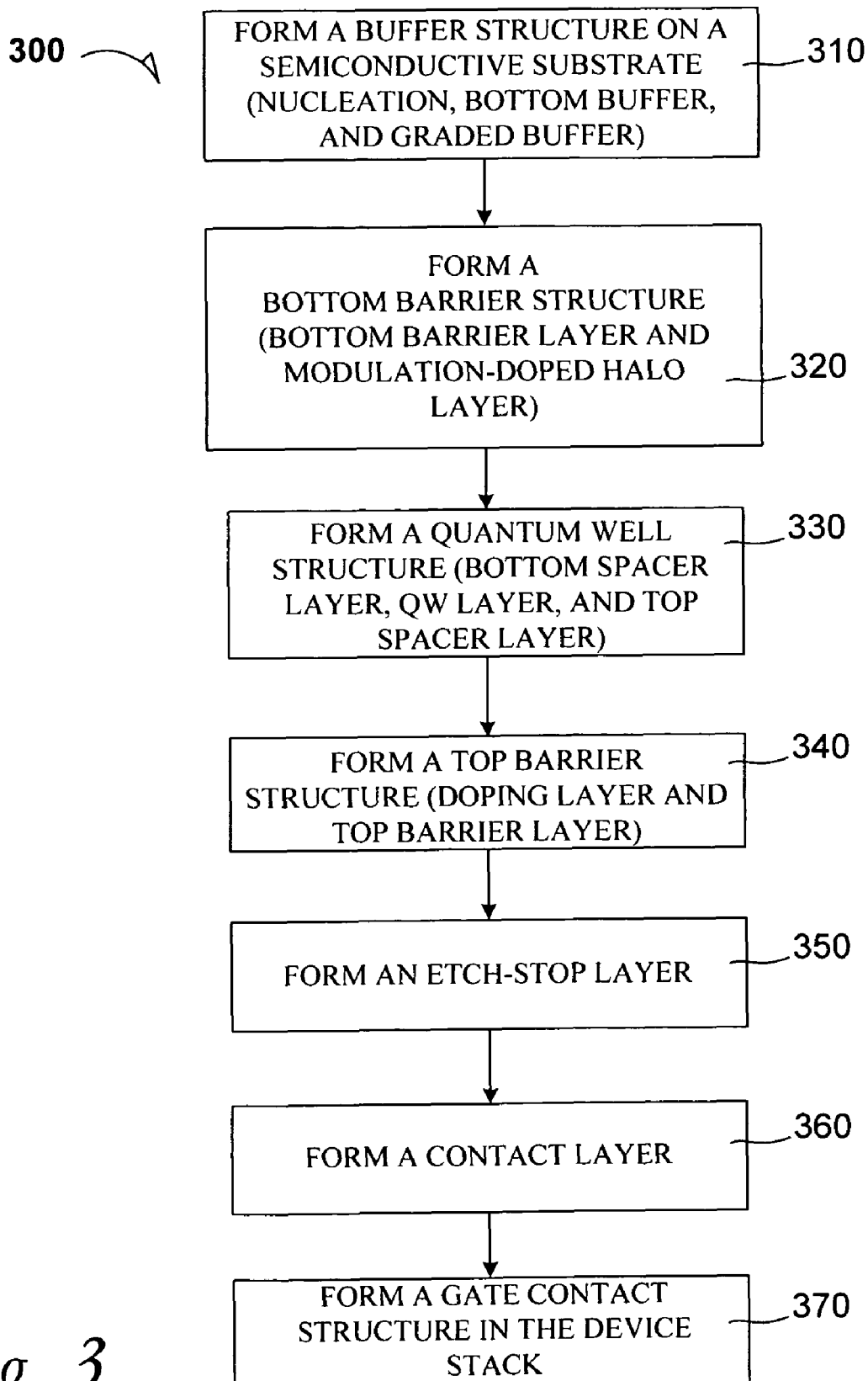
FIG. 3 is a process flow diagram according to an embodiment.

FIG. 3 is a process flow diagram according to an embodiment.

At 310, the process includes forming a buffer structure on a semiconductive substrate. In a non-limiting example embodiment, the buffer structure includes the nucleation layer 112, the bottom buffer layer 114, and the graded buffer layer 116.

At 320, the process includes forming a bottom barrier structure above the buffer structure. In a non-limiting example embodiment, the bottom barrier structure includes the bottom barrier layer 118 and the modulation-doped beryllium halo layer 120.

At 330, the process includes forming a quantum-well structure above the bottom barrier structure. In a non-limiting example, the quantum well structure includes the bottom spacer layer 122, the QW layer 124, and the top spacer layer 126.

At 340, the process includes forming a top barrier structure. In a non-limiting example, the top barrier structure includes the doping layer 126 and the top barrier layer 128.

At 350, the process includes forming an etch-stop layer above the top barrier structure. In a non-limiting embodiment, the etch-stop layer 142 is an InP material.

At 360, the process includes forming a contact layer above the etch-stop layer. In a non-limiting example, the contact layer 144 is configured for an NMOS device stack 132. In a non-limiting example, the contact layer 144 is configured for a PMOS device stack 132.

At 370, the process includes forming a gate contact structure in the device stack. In a non-limiting example, the gate contact 152 is formed in the gate recess 146 between the gate spacers 150 and above and on the gate dielectric 148. Further, the device stack 132 includes the source- and drain contacts 154 and 156, respectively.

Figure 4:
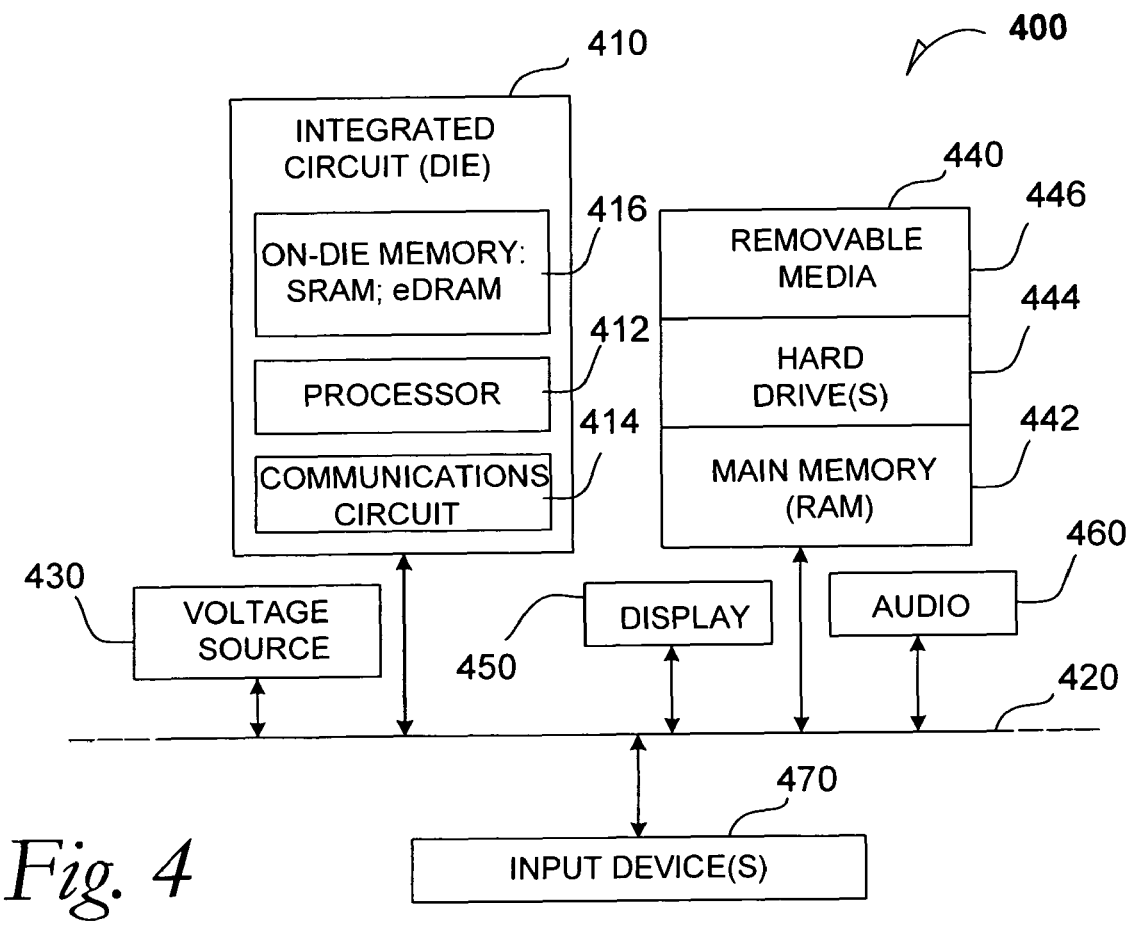
FIG. 4 is a schematic of an electronic system according to an embodiment.

FIG. 4 is a schematic of an electronic system 400 according to an embodiment. The electronic system 400 as depicted can embody modulation-doped halo layer in bottom barrier embodiments with high-k gate dielectric layer embodiments as set forth in this disclosure. In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically coupled to the system bus 420 and includes any circuit, or combination of circuits according to an embodiment. In an embodiment, the integrated circuit 410 includes a processor 412 that can be of any type. As used herein, the processor 412 may mean any type of circuit such as, but not limited to, a microprocessor, a microcontroller, a graphics processor, a digital signal processor, or another processor. Other types of circuits that can be included in the integrated circuit 410 are a custom circuit or an application-specific integrated circuit (ASIC), such as a communications circuit 414 for use in wireless devices such as cellular telephones, pagers, portable computers, two-way radios, and similar electronic systems. In an embodiment, the processor 410 includes on-die memory 416 such as static random-access memory (SRAM). In an embodiment, the processor 410 includes embedded on-die memory 416 such as embedded dynamic random-access memory (eDRAM) that can be a cache memory for the processor.

In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory keys, and other removable media known in the art. The various memory functionalities can contain composite spacer embodiments with high-k gate dielectric layer embodiments.

In an embodiment, the electronic system 400 also includes a display device 450, an audio output 460. In an embodiment, the electronic system 400 includes a controller 470, such as a keyboard, mouse, trackball, game controller, microphone, voice-recognition device, or any other device that inputs information into the electronic system 400.

As shown herein, the integrated circuit 410 can be implemented in a number of different embodiments, including a modulation-doped halo layer in a bottom barrier structure embodiment, an electronic system, a computer system, one or more methods of fabricating an integrated circuit, and one or more methods of fabricating an electronic assembly that includes a modulation-doped halo layer in a bottom barrier structure embodiment as set forth herein in the various embodiments and their art-recognized equivalents. The elements, materials, geometries, dimensions, and sequence of operations can all be varied to suit particular composite spacers with a high-k gate dielectric layer embodiments.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A transistor apparatus comprising:
   a buffer structure disposed above and on a semiconductive substrate:
   a bottom barrier structure disposed above and on the buffer structure, wherein the bottom barrier structure includes a InAlAs containing material of a bottom barrier layer and a modulation-doped, beryllium-containing silicon material halo layer;
   a quantum well structure disposed above and on the bottom barrier structure;
   a top barrier structure disposed above and on the quantum well structure;
   an etch-stop layer disposed above and on the top barrier structure; and
   a gate contact structure coupled to the quantum well structure, wherein the quantum-well structure includes an InGaAs quantum well layer, an InAlAs containing bottom spacer layer, and a InAlAs top spacer layer, and wherein the top barrier structure includes a silicon doping layer disposed above and on the quantum-well structure and an $In_{0.52}Al_{0.48}As$-containing top barrier layer disposed above and on the silicon doping layer.

2. A transistor apparatus comprising:
   a buffer structure disposed above and on a semiconductive substrate:
   a bottom barrier structure disposed above and on the buffer structure, wherein the bottom barrier structure includes a InAlAs containing material of a bottom barrier layer and a modulation-doped, beryllium-containing silicon material halo layer;
   a quantum well structure disposed above and on the bottom barrier structure;
   a top barrier structure disposed above and on the quantum well structure;
   an etch-stop layer disposed above and on the top barrier structure; and
   a gate contact structure coupled to the quantum well structure, wherein the quantum-well structure includes an $In_{0.7}Ga_{0.3}As$ quantum well layer, an $In_{0.52}Al_{0.48}As$ containing bottom spacer layer, and an $In_{0.52}Al_{0.48}As$ top spacer layer, and wherein the top barrier structure includes a silicon doping layer disposed above and on the quantum-well structure and an $In_{0.52}Al_{0.48}As$-containing top barrier layer disposed above and on the silicon doping layer.

3. A transistor apparatus comprising:
   a buffer structure disposed above and on a semiconductive substrate:
   a bottom barrier structure disposed above and on the buffer structure, wherein the bottom barrier structure includes a InAlAs containing material of a bottom barrier layer and a modulation-doped, beryllium-containing silicon material halo layer;
   a quantum well structure disposed above and on the bottom barrier structure;
   a top barrier structure disposed above and on the quantum well structure;
   an etch-stop layer disposed above and on the top barrier structure; and
   a gate contact structure coupled to the quantum well structure, wherein the quantum-well structure includes an $In_{0.7}Ga_{0.3}As$ quantum well layer, an $In_{0.52}Al_{0.48}As$ containing bottom spacer layer, and an $In_{0.52}Al_{0.48}As$ top spacer layer, and wherein the top barrier structure includes a silicon doping layer disposed above and on the quantum-well structure and an $In_{0.52}Al_{0.48}As$-containing top barrier layer disposed above and on the silicon doping layer.

4. A transistor apparatus comprising:
   a buffer structure disposed above and on a semiconductive substrate:
   a bottom barrier structure disposed above and on the buffer structure, wherein the bottom barrier structure includes a InAlAs containing material of a bottom barrier layer and a modulation-doped, beryllium-containing silicon material halo layer;
   a quantum well structure disposed above and on the bottom barrier structure;
   a top barrier structure disposed above and on the quantum well structure;
   an etch-stop layer disposed above and on the top barrier structure; and
   a gate contact structure coupled to the quantum well structure, wherein the top barrier structure includes a silicon doping layer disposed above and on the quantum-well structure and an $In_{0.52}Al_{0.48}As$-containing top barrier layer disposed above and on the silicon doping layer, and wherein doping in the modulation-doped halo layer is the same as doping in the silicon doping layer.

5. A transistor apparatus comprising:
   a buffer structure disposed above and on a semiconductive substrate:
   a bottom barrier structure disposed above and on the buffer structure, wherein the bottom barrier structure includes a InAlAs containing material of a bottom barrier layer and a modulation-doped, beryllium-containing silicon material halo layer;
   a quantum well structure disposed above and on the bottom barrier structure;
   a top barrier structure disposed above and on the quantum well structure;
   an etch-stop layer disposed above and on the top barrier structure; and
   a gate contact structure coupled to the quantum well structure, wherein the modulation-doped, beryllium-containing silicon material halo layer is disposed below and on the bottom spacer layer;
   wherein the buffer structure includes a GaAs-containing nucleation layer disposed above and on the semiconductive substrate, a GaAs-containing buffer layer disposed above and on the nucleation layer, and an $In_xAl_{l-x}As$ graded buffer layer disposed above and on the buffer layer, and grading proceeds from x equals zero to x equals 0.52;
   wherein the bottom barrier structure includes an $In_{0.52}Al_{0.48}As$ bottom barrier layer disposed above and on the buffer structure;
   wherein the quantum-well structure includes an $In_{0.7}Ga_{0.3}As$ quantum well layer, an $In_{0.52}Al_{0.48}As$ containing bottom spacer layer, and an $In_{0.52}Al_{0.48}As$ top spacer;
   wherein the top barrier structure includes a silicon doping layer disposed above and on the quantum-well structure and an $In_{0.52}Al_{0.48}As$-containing top barrier layer disposed above an on the silicon doping layer.

6. A transistor apparatus comprising:
   a buffer structure disposed above and on a semiconductive substrate:
   a bottom barrier structure disposed above and on the buffer structure, wherein the bottom barrier structure includes a InAlAs containing material of a bottom barrier layer and a modulation-doped, beryllium-containing silicon material halo layer;
   a quantum well structure disposed above and on the bottom barrier structure;
   a top barrier structure disposed above and on the quantum well structure;
   wherein the top barrier structure includes a silicon doping layer disposed above and on the quantum-well structure and an $In_{0.52}Al_{0.48}As$-containing top barrier layer disposed above and on the silicon doping layer;
   an etch-stop layer disposed above and on the top barrier structure; and
   a gate contact structure coupled to the quantum well structure, wherein the gate contact structure includes:
      a gate dielectric layer disposed in a gate recess and upon the quantum well structure;
      a gate spacer; and
      a metal gate electrode disposed in the gate recess.

7. A computing system with a transistor device comprising:
   a semiconductive die, and in the semiconductive die:
   a quantum well (QW) layer on a semiconductive substrate, wherein the semiconductive substrate includes a InAlAs bottom barrier below the QW layer, and wherein the quantum well includes an InGaAs composition;
   a beryllium-doped halo layer disposed below the QW layer;
   an InAlAs bottom spacer disposed between and adjacent each of the QW layer and the halo layer;
   an InAlAs spacer disposed above and on the QW layer;
   a delta doped Si layer disposed above on the InAlAs spacer;
   an InAlAs top barrier disposed above and on the Si layer;
   an InP etch stop layer disposed above and on the InAlAs top barrier;
   an $In_xGa_{l-x}As$ (x=0.53 to 1.0) contact layer disposed above and on the InP etch stop layer;
   a high-k dielectric layer disposed in a recess that breaches and penetrates the delta doped Si layer;
   a gate contact disposed on the high-k dielectric layer; and
   external memory coupled to the semiconductive die.

8. The computing system of claim 7, further including:
   a source contact disposed at the recess on the InGaAs contact layer on one side thereof;
   a drain contact disposed at the recess on the InGaAs contact layer on one side thereof; and wherein the QW layer is part of a transistor for a logic circuit.

9. The computing system of claim 7, further including:
a source contact disposed at the recess on the InGaAs contact layer on one side thereof;
a drain contact disposed at the recess on the InGaAs contact layer on one side thereof; and
wherein the QW layer is part of a transistor for a memory circuit.

10. The computing system of claim 7, wherein the computing system is part of one of a cellular telephone, a pager, a portable computer, a desktop computer, and a two-way radio.

11. A transistor apparatus comprising:
a buffer structure disposed above and on a semiconductive substrate:
a bottom barrier structure disposed above and on the buffer structure, wherein the bottom barrier structure includes a InAlAs containing material of a bottom barrier layer and a modulation-doped, beryllium-containing silicon material halo layer;
a quantum well structure disposed above and on the bottom barrier structure;
a top barrier structure disposed above and on the quantum well structure, wherein the top barrier structure includes a silicon doping layer disposed above and on the quantum-well structure and an $In_{0.52}Al_{0.48}As$-containing top barrier layer disposed above and on the silicon doping layer, and wherein doping in the modulation-doped halo layer is the same as doping in the silicon doping layer;
an etch-stop layer disposed above and on the top barrier structure; and
a gate contact structure coupled to the quantum well structure, wherein the gate contact structure includes:
a gate dielectric layer disposed in a gate recess and upon the quantum well structure;
a gate spacer; and
a metal gate electrode disposed in the gate recess.

12. The transistor apparatus of claim 11:
wherein the modulation-doped, beryllium-containing silicon material halo layer is disposed below and on the bottom spacer layer;
wherein the buffer structure includes a GaAs-containing nucleation layer disposed above and on the semiconductive substrate, a GaAs-containing buffer layer disposed above and on the nucleation layer, and an $In_xAl_{1-x}As$ graded buffer layer disposed above and on the buffer layer, and grading proceeds from x equals zero to x equals 0.52;
wherein the bottom barrier structure includes an $In_{0.52}Al_{0.48}As$ bottom barrier layer disposed above and on the buffer structure;
wherein the quantum-well structure includes an $In_{0.7}Ga_{0.3}As$ quantum well layer, an $In_{0.52}Al_{0.48}As$ containing bottom spacer layer, and an $In_{0.52}Al_{0.48}As$ top spacer;
wherein the top barrier structure includes a silicon doping layer disposed above and on the quantum-well structure and an InAlAs-containing top barrier layer disposed above an on the silicon doping layer.

* * * * *

UNITED STATES PATENT AND TRADEMARK OFFICE
CERTIFICATE OF CORRECTION

| | | |
|---|---|---|
| PATENT NO. | : 8,115,235 B2 | Page 1 of 1 |
| APPLICATION NO. | : 12/378828 | |
| DATED | : February 14, 2012 | |
| INVENTOR(S) | : Ravi Pillarisetty et al. | |

It is certified that error appears in the above-identified patent and that said Letters Patent is hereby corrected as shown below:

In column 10, line 2, in claim 5, delete "$In_xAl_{1-x}As$" and insert -- $In_xAl_{1-x}As$ --, therefor.

In column 10, line 16, in claim 5, delete "an" and insert -- and --, therefor.

In column 10, line 57, in claim 7, delete "$In_xGa_{1-x}As$" and insert -- $In_xGa_{1-x}As$ --, therefor.

In column 12, line 14, in claim 12, delete "$In_xAl_{1-x}As$" and insert -- $In_xAl_{1-x}As$ --, therefor.

In column 12, line 28, in claim 12, delete "an" and insert -- and --, therefor.

Signed and Sealed this
Eighth Day of May, 2012

David J. Kappos
*Director of the United States Patent and Trademark Office*